United States Patent [19]

Yoshikawa

[11] Patent Number: 4,925,807
[45] Date of Patent: May 15, 1990

[54] METHOD OF MANUFACTURING A SEMICONDUCTOR DEVICE

[75] Inventor: Kuniyoshi Yoshikawa, Tokyo, Japan

[73] Assignee: Kabushiki Kaisha Toshiba, Kawasaki, Japan

[21] Appl. No.: 371,795

[22] Filed: Jun. 27, 1989

[30] Foreign Application Priority Data

Jun. 30, 1988 [JP] Japan .................. 63-160827

[51] Int. Cl.⁵ ........................................ H01L 21/265
[52] U.S. Cl. ........................................ 437/44; 437/41; 437/192; 437/200; 357/23.3
[58] Field of Search .................. 437/40, 41, 44, 192, 437/200, 245, 233, 238

[56] References Cited

U.S. PATENT DOCUMENTS

| 4,488,351 | 12/1984 | Momose | 437/41 |
| 4,587,718 | 5/1986 | Haken et al. | 437/200 |
| 4,613,882 | 7/1987 | Wei et al. | 437/44 |
| 4,616,401 | 10/1986 | Takeuchi | 437/29 |
| 4,658,496 | 4/1987 | Beinvogl et al. | 437/200 |
| 4,680,603 | 9/1986 | Pimbley et al. | 437/44 |
| 4,703,551 | 11/1987 | Szluk et al. | 437/44 |
| 4,727,038 | 2/1988 | Watabe et al. | 437/200 |
| 4,735,680 | 4/1988 | Yen | 437/200 |
| 4,753,898 | 6/1988 | Parrillo et al. | 437/44 |
| 4,788,160 | 11/1988 | Havemann et al. | 437/200 |
| 4,824,796 | 4/1989 | Chiu et al. | 437/41 |
| 4,835,112 | 5/1989 | Pfiester et al. | 437/27 |

OTHER PUBLICATIONS

Saitoh et al., "Degradation Mechanism of Lightly Doped Drain (LLD) N-Channel MOSFET's Studied by Ultraviolet Light Irradiation", J. Electrochem. Soc., vol. 132, No. 10, Oct. 1985, pp. 2463-2466.
Chao et al., "Stepped Oxide Spacer Process for Self-Aligned Silicide Without Bridging", IBM Technical Disclosure Bulletin, vol. 26, No. 7B, Dec. 1983, pp. 3842-3844.
Hsu et al., "Structure-Enhanced MOSFET Degradation Due to Hot-Electron Injection," IEEE Electron Device Letters, vol. EDL-5, No. 3, pp. 71-73, Mar. 1984.
Huang et al., "A Novel Submicron LDD Transistor with Inverse-T Gate Structure," IEDM Technical Digest, pp. 742-745, Dec. 7, 1986.

Primary Examiner—Brian E. Hearn
Assistant Examiner—M. Wilczewski
Attorney, Agent, or Firm—Finnegan, Henderson, Farabow, Garrett and Dunner

[57] ABSTRACT

A method of manufacturing a semiconductor device comprises the steps of forming a first insulation and a first conductive films on a surface of a semiconductor region of a first conductivity type subsequently, forming a second insulation film over the surface of the patterned first conductive film, forming a first and a second impurity-diffused layer of a second conductivity type, forming a second conductive and a third insulation films over the first and second insulation films subsequently, performing an anisotropic etching to cause a lamination film of the second and third insulation films to remain in a region of a side wall of the patterned first conductive layer, forming a third and a fourth impurity-diffused layer of the second conductivity type, the concentration of impurities in which layers being higher than that of impurities in the first and second impurity-diffused layers, selectively forming a third conductive film over the first and second conductive films which have been exposed, and connecting the first and second conductive films with each other by the third conductive film, whereby the second conductive film serving as a gate electrode is formed on the first and second inpurity-diffused layers for relaxing an electric field.

15 Claims, 7 Drawing Sheets

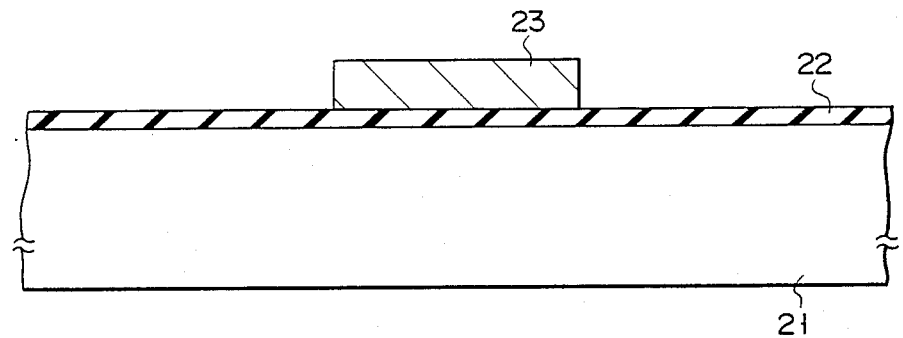
F I G. 2A
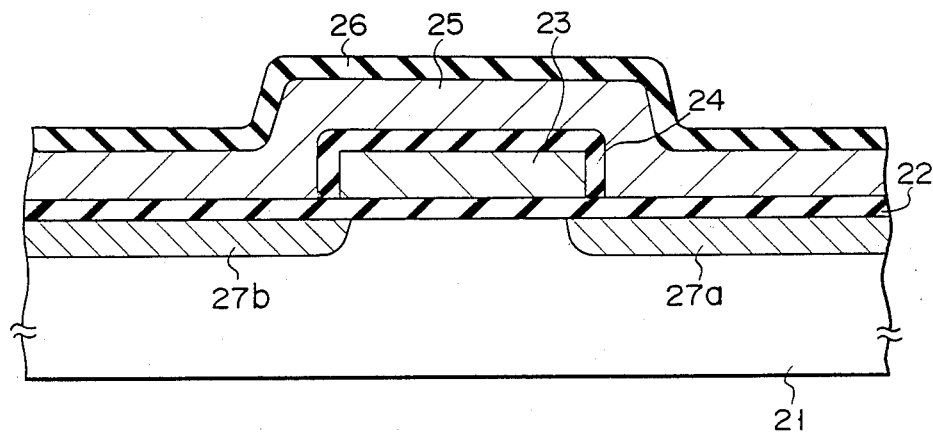
F I G. 2B
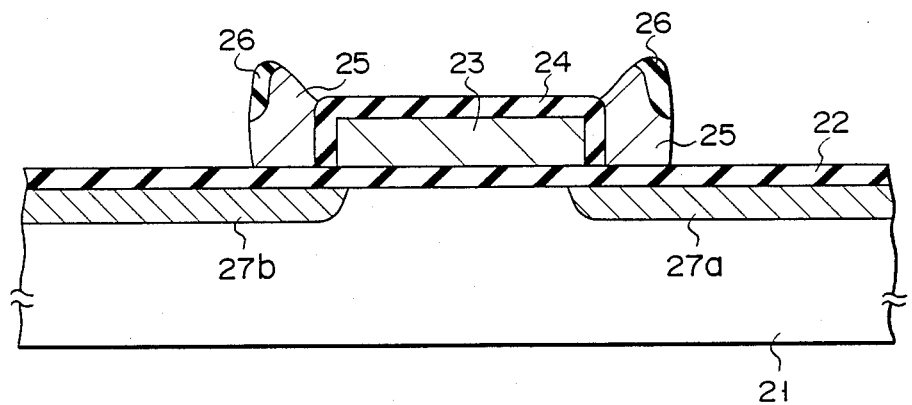
F I G. 2C

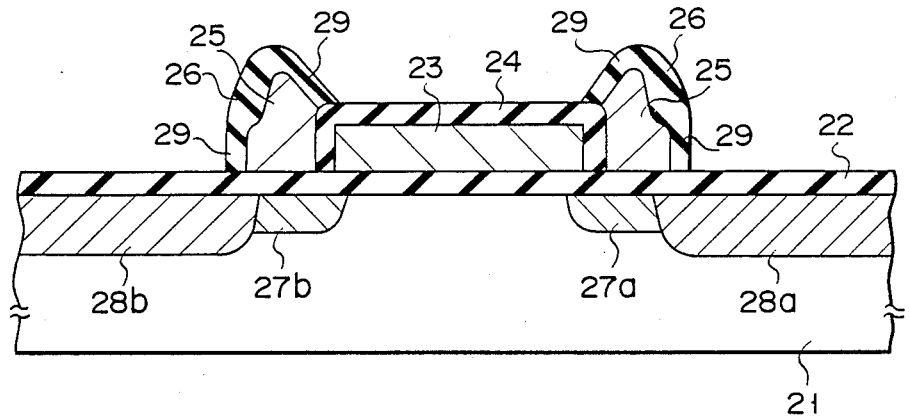
F I G. 2D
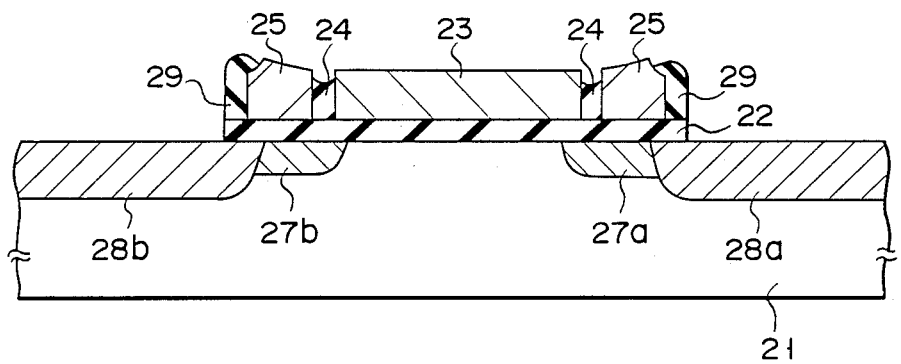
F I G. 2E
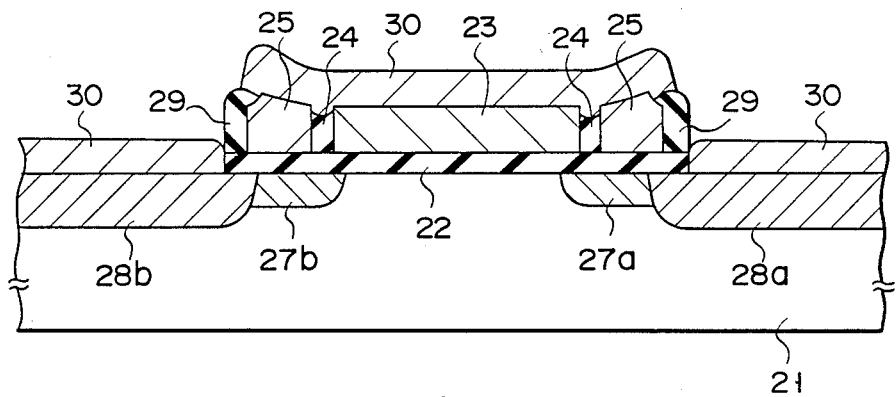
F I G. 2F

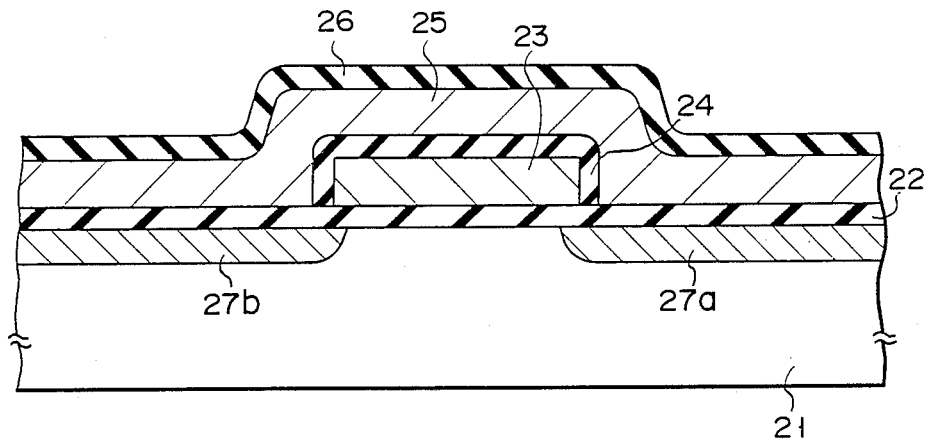
F I G. 3A
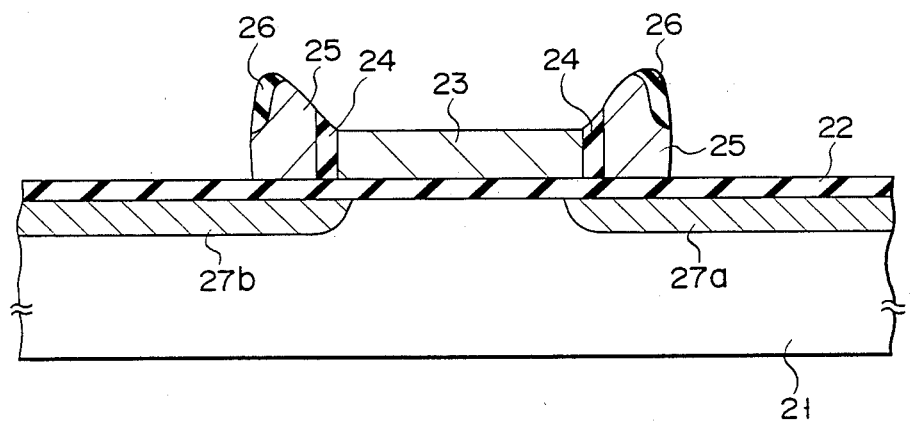
F I G. 3B

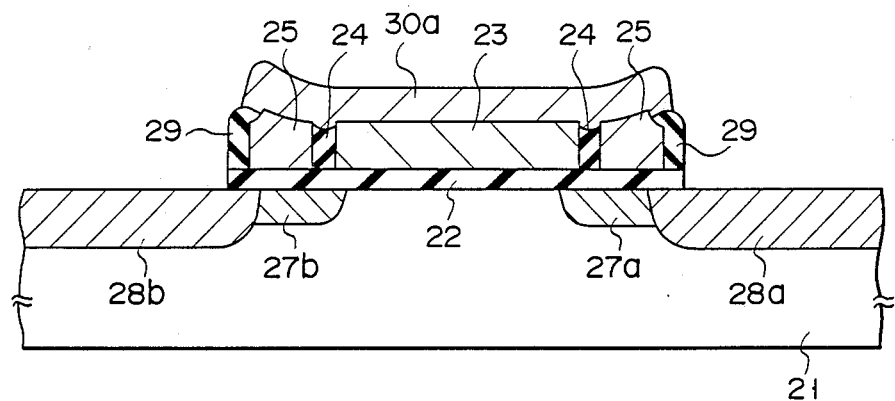
F I G. 4A
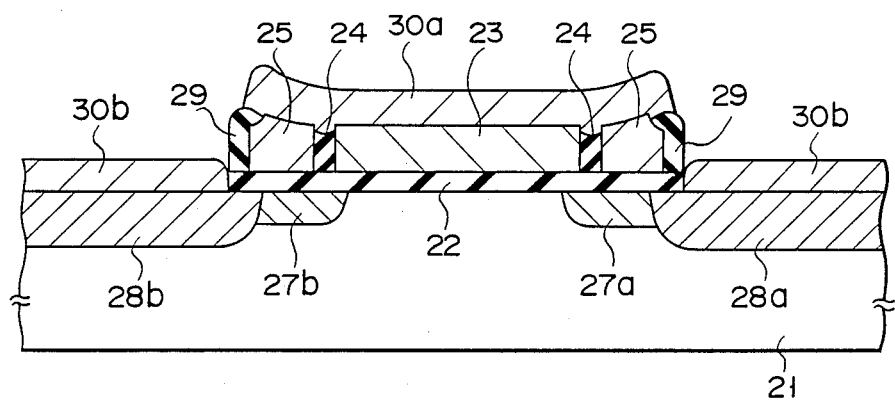
F I G. 4B

METHOD OF MANUFACTURING A SEMICONDUCTOR DEVICE

BACKGROUND OF THE INVENTION

1. Field of the Invention

The present invention relates to a method of manufacturing a semiconductor device having a MOS transistor with an LDD (lightly doped drain) structure.

2. Description of the Related Art

A small-sized N-channel type MOS transistor has an LDD (lightly doped drain) structure for preventing an electric field from being concentrated in its drain region. In the LDD structure, a low-density impurity-diffused layer is provided in contact with a drain region near a gate electrode. FIG. 1 shows an example of an N-channel type MOS transistor having the LDD structure. In this MOS transistor, $N^+$-type impurity-diffused layers 12a and 12b, one of which serves as a source region and the other of which serves as a drain region, are formed on the surface of a P-type silicon substrate 11. Also, $N^-$-type impurity-diffused layers 13a and 13b for relaxing an electric field are formed in contact with the $N^+$-type impurity-diffused layers 12a and 12b. A gate insulation film 14 is formed on a channel region between the $N^-$-type impurity-diffused layers 13a and 13b. A gate electrode 15 is formed on the gate insulation film 14.

According to the above structure, by virtue of the $N^-$-type impurity-diffused layers 13a and 13b for relaxing an electric field, which are provided in contact with the $N^+$-type impurity-diffused layer and near the gate electrode 15, the concentration of an electric field in the drain region can be prevented, and the amount of produced hot carries can be reduced.

In the above MOS transistor with the LDD structure, however, the degradation in characteristic with respect to a unit hot carrier is considerable, and a reliability proportional to the reduction in amount of produced hot carriers cannot be obtained. (These problems are set forth in *IEEE ELECTRON DEVICE LETTERS*, VOL. EDL-5, NO. 3, MARCH 1984, pp. 71-74.)

SUMMARY OF THE INVENTION

The present invention has been devised in order to solve the above problem in which the reliability of the semiconductor device cannot be enhanced in accordance with the reduction in amount of produced hot carriers, and the object of the present invention is to provide a method of manufacturing a semiconductor device, wherein the reliability of the device can be enhanced in accordance with the reduction in amount of produced hot carriers, without preventing the miniaturization of the device.

In order to achieve the above object, a method of manufacturing a semiconductor device, according to the present invention, comprises the steps of forming a gate insulation film on a main surface of a semiconductor region of a first conductivity type; forming a first conductive film on the gate insulation film; patterning the first conductive film; implanting impurity ions in the semiconductor region by using the patterned first conductive film as a mask, thereby to form a first and a second impurity-diffused layers of a second conductivity type; forming a first insulation layer over the resulting entire structure; forming a second conductive layer over the resulting entire structure; forming a second insulation film over the resulting entire structure; performing an anisotropic etching to cause a lamination film of the second conductive layer and the second insulation layer to remain only on a side all of the first insulation layer existing on a side wall of the patterned first conductive layer; implanting impurity ions in the semiconductor region by using the first conductive layer, the first insulation layer, the second conductive layer and the second insulation layer as masks, thereby to form a third and a fourth impurity-diffused layer of the second conductivity type, the concentration of impurities in the third and fourth impurity-diffused layers being higher than that of impurities in the first and second impurity-diffused layers; forming a third insulation layer over the exposed second conductive layer; performing an anisotropic etching to expose the first conductive layer and the second conductive layer extending in parallel to the main surface of the semiconductor region; and selectively forming a third conductive layer over the exposed first and second conductive layers, whereby the first and second conductive layers are connected to each other.

In the present invention, by forming the third conductive layer of a refractory metal or a refractory metal silicide, a gate electrode can also be created on the first and second impurity-diffused layer having a low impurity concentration, and the reliability of the semiconductor device can be enhanced in accordance with the reduction in amount of produced hot carriers.

BRIEF DESCRIPTION OF THE DRAWINGS

FIGS. 2A to 2F are cross sections illustrating a method of manufacturing a semiconductor device according to a first embodiment of the present invention;

FIGS. 3A to 3D are cross sections illustrating a method of manufacturing a semiconductor device according to a second embodiment of the present invention;

FIGS. 4A and 4B are cross sections illustrating a method of manufacturing a semiconductor device according to a third embodiment of the present invention.

DETAILED DESCRIPTION OF THE PREFERRED EMBODIMENTS

Figure 1:
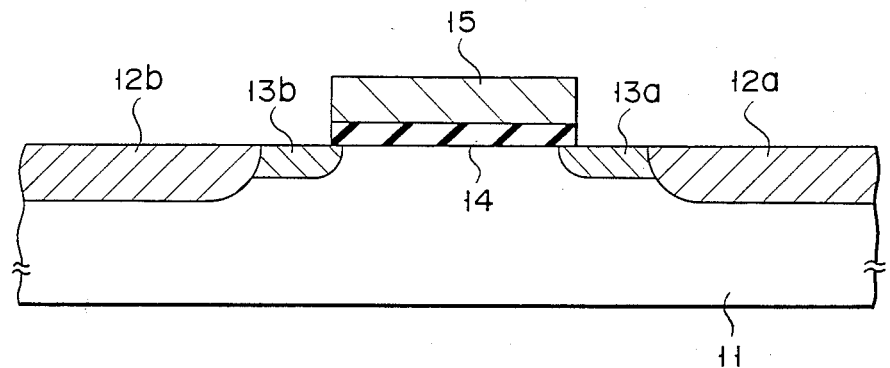
FIG. 1 is a cross section of a conventional semiconductor device.

Methods of manufacturing semiconductor devices according to embodiments of the present invention will now be described with reference to the accompanying drawings. In the drawings, the same structural elements are denoted by the same reference numerals.

FIGS. 2A to 2F are cross sections illustrating a method of manufacturing an N-channel type MOS transistor according to a first embodiment of the present invention.

As shown in FIG. 2A, a gate insulation film (first insulation film) 22 having a thickness of about 0.02 μm is formed on the surface of a silicon substrate (semiconductor region) 21. Then, a polycrystalline silicon film (first conductive film) 23 having a thickness of 0.4 μm, which is doped with phosphorus, is deposited on the gate insulation film 22. The polycrystalline silicon film 23 may be formed by first depositing a nondoped polycrystalline silicon film on the gate insulating film 22 and then doping the silicon film with phosphorus by a POCl$_3$ diffusion process. Thereafter, the polycrystalline silicon film 23 is patterned by using a photolithograpy technique.

In FIG. 2B, the surface of the polycrystalline silicon film 23 is subjected to thermal oxidation to form a silicon oxide film (second insulation film) 24 having a thickness of about 0.02 μm. By using the polycrystalline silicon film 23 and silicon oxide film 24 as masks, phosphorus is ion-implanted at the acceleration voltage of about 40 KeV and with the dose amount of about $2\times10^{13}$ cm$^{-2}$. Subsequently, a polycrystalline silicon film (second conductor film) 25 having a thickness of 0.4 μm, over which phosphorus has been doped, is deposited. The polycrystalline silicon film 25, too, may be formed by first depositing a nondoped polycrystalline silicon film on the gate insulating film 22 and then doping the silicon film with phosphorus by a POCl$_3$ diffusion process. Then, a silicon oxide film (third insulation film) 26 having a thickness of about 0.2 μm is formed on the surface of the polycrystalline silicon film 25. By the thermal hysteresis in this diffusion process, N$^-$-type impurity-diffused layers (first and second impurity-diffused layers) 27a and 27b for relaxing an electric field are formed in a surface region of the silicon substrate 21.

As shown in FIG. 2C, by using an anisotropic etching technique such as RIE (reactive ion etching), the polycrystalline silicon film 25 and the silicon oxide film 26 are successively etched. As a result, portions of the polycrystalline silicon film 25 and silicon oxide film 26 remain at a region of the side wall of the polycrystalline silicon film 23.

In a step illustrated in FIG. 2D, by using the polycrystalline silicon films 23 and 25 and the silicon oxide films 24 and 26 as masks, arsenic is ion-implanted at the acceleration voltage of about 40 KeV and with the dose amount of about $5\times10^{15}$ cm$^{-2}$. The resulting structure is subjected to thermal oxidation in an oxygen atmosphere at a temperature of about 900° C. for a duration of about 30 minutes. As a result, the ionimplanted region is activated, and N$^+$-type impurity-diffused layers (third and fourth impurity-diffused layers) 28a and 28b are formed, and also a silicon oxide film 29 is formed on an exposed region of the polycrystalline silicon film 25.

Then, as shown in FIG. 2E, the resulting structure is etched by an anisotropic etching technique such as RIE, thereby to expose the surfaces of the N$^+$-type impurity-diffused layers 28a and 28b and the surfaces of the polycrystalline silicon films 23 and 25.

In the next step shown in FIG. 2F, a selective deposition method is carried out by using a refractory metal (e.g., tungsten), thus selectively forming a refractory metallic film (third conductive film) 30 over the surfaces of the N$^+$-type impurity-diffused layers 28a and 28b and the surfaces of the polycrystalline silicon films 23 and 25. The thickness of the refractory metallic film 30 is sufficiently larger (e.g., 0.2 μm) than that of the silicon oxide film 24. In this manner, the polycrystalline silicon film 23 is connected to the polycrystalline silicon film 25 by the refractory metallic film 30, whereby an N-channel type MOS transistor can be created.

According to the above method of manufacturing a semiconductor device, a gate electrode (polycrystalline silicon films 23 and 25 and refractory metallic film 30) can be formed also on the N$^-$-type impurity-diffused layers 27a and 27b for relaxing an electric field. Therefore, the reliability of the semiconductor device can be enhanced in accordance with the reduction in amount of hot carriers. In addition, the MOS transistor manufactured by the method of the present invention has a high current drive capability.

FIGS. 3A to 3D are cross sections illustrating a method of manufacturing an N-channel type MOS transistor according to a second embodiment of the present invention.

Figure 3C:
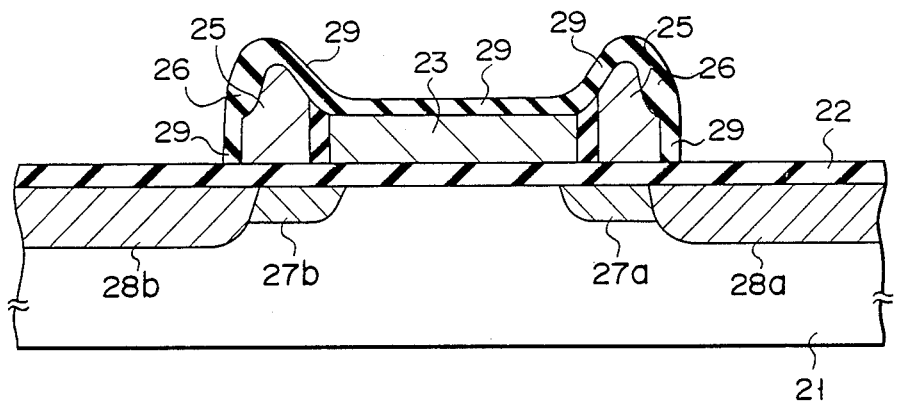
Figure 3D:
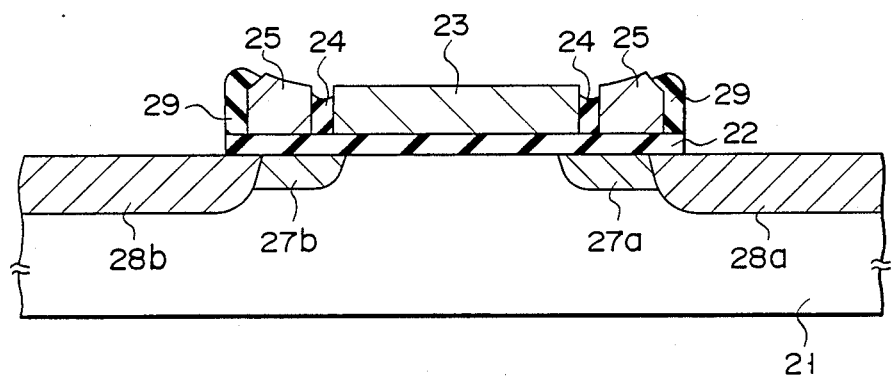

As shown in FIG. 3A, in the same manner as in the first embodiment, the surface of the polycrystalline silicon film 25 is subjected to thermal oxidation to form the silicon oxide film 26, and the N$^-$-type impurity-diffused layers 27a and 27b for relaxing an electric field are formed. Then, as shown in FIG. 3B, the silicon oxide film 24, the polycrystalline silicon film 25 and the silicon oxide film 26 are successively etched by an anisotropic etching technique such as RIE. As a result, portions of the silicon oxide film 24, the polycrystalline silicon film 25 and the silicon oxide film 26 are left in a region of the side wall of the polycrystalline silicon film 23. Then, as shown in FIG. 3C, by using the polycrystalline silicon films 23 and 25 and silicon oxide films 24 and 26 as masks, arsenic is ion-implanted at an acceleration voltage of about 40 KeV and with a dose amount of about $5\times10^{15}$ cm$^{-2}$. The resulting structure is subjected to thermal oxidation in an oxygen atmosphere at a temperature of about 900° C. for a period of about 30 minutes. The ion-implanted region is thus activated, and the N$^+$-type impurity-diffused layers 28a and 28b are formed. Simultaneously, the silicon oxide film 29 is formed on exposed portions of the polycrystalline silicon films 23 and 25. The resulting structure is etched by an anisotropic etching technique such as RIE, as shown in FIG. 3D, to expose the surfaces of the N$^+$-type impuritydiffused layers 28a and 28b and the surfaces of the polycrystalline silicon films 23 and 25. Thereafter, in the same manner as in the first embodiment, an N-channel type MOS transistor is manufactured.

By the above method, too, a gate electrode can be formed on the N$^-$-type impurity-diffused layers 27a and 27b for relaxing an electric field, the same effects as in the first embodiment can be brought about.

The first and second embodiments shown in FIGS. 2A to 2F and FIGS. 3A to 3D may be modified as follows:

Namely, FIGS. 4A to 4B are cross sections illustrating a method of manufacturing an N-channel type MOS transistor according to a third embodiment of the present invention.

As shown in FIG. 4A, the steps of the first and second embodiments are repeated until the surfaces of the N$^+$-type impurity-diffused layers 28a and 28b and the surfaces of the polycrystalline silicon films 23 and 25 are exposed. A selective deposition method is performed by using a refractory metal (e.g., tungsten) to selectively form a refractory metallic film (third conductive film) 30a over the surfaces of the polycrystalline silicon films 23 and 25. The thickness of the refractory metallic film 30a is sufficiently greater (e.g., 0.2 μm) than that of the silicon oxide film 24, whereby the polycrystalline silicon films 23 and 25 are connected by the refractory metallic film 30a. Thereafter, as shown in FIG. 4B, a selective deposition method is carried out by using a refractory metal (e.g., tungsten) to selectively form a refractory metallic film (fourth conductive film) 30b over the N$^+$-type impurity-diffused layers 28a and 28b. Thus, an N-channel type MOS transistor is formed.

Figure 5A:
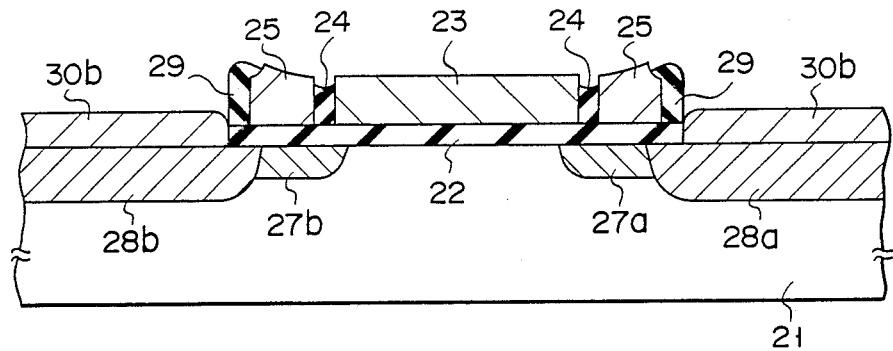
FIGS. 5A and 5B are cross sections illustrating a method of manufacturing a semiconductor device according to a fourth embodiment of the present invention.
Figure 5B:
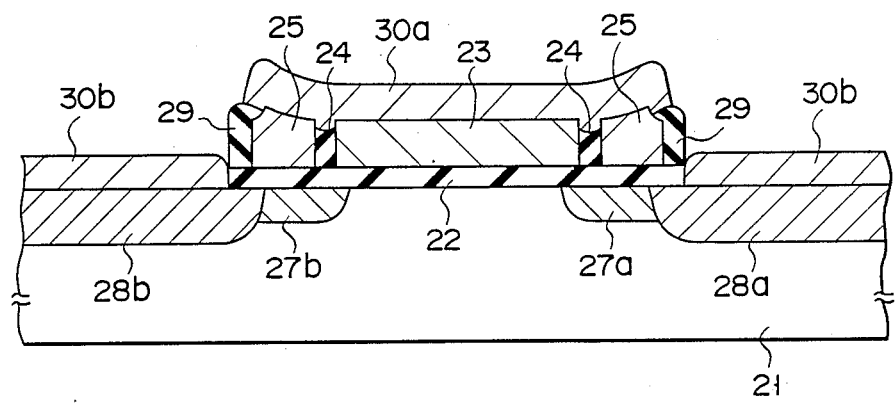

FIGS. 5A and 5B are cross sections illustrating a method of manufacturing an N-channel type MOS transistor according to a fourth embodiment of the present invention.

As shown in FIG. 5A, the steps of the first and second embodiments are repeated until the surfaces of the N+-type impurity-diffused layers 28a and 28b and the surfaces of the polycrystalline silicon films 23 and 25 are exposed. A selective disposition method is performed S by using a refractory metal (e.g., tungsten) to selectively form a refractory metallic film 30b over the surfaces of the N+-type impurity-diffused layers 28a and 28b. Thereafter, as shown in FIG. 5B, a selective deposition method is carried out by using a refractory metal (e.g., tungsten) to selectively form a refractory metallic film 30a over the polycrystalline silicon films 23 and 25. The thickness of the refractory metallic film 30a is sufficiently greater (e.g., 0.2 $\mu$m) than that of the silicon oxide film 24, whereby the polycrystalline silicon films 23 and 25 are connected by the refractory metallic film 30a. Thus, an N-channel type MOS transistor is formed.

In the above embodiments, it is desirable that the N−-type impurity-diffused layer for relaxing an electric field be formed in the drain region. Also, the refractory metal employed in the selective deposition may be converted into refractory metallic silicide (e.g., tungsten silicide) by thermal treatment. Also, the material of the conductive layer formed by the selective deposition is not limited to a refractory metal or a silicide thereof. For example, selectively epitaxial-grown silicon material may be used. In addition, the method of the present invention is applicable not only to the manufacture of an N-channel type MOS transistor, but also to a P-channel type MOS transistor.

What is claimed is:

1. A method of manufacturing a semiconductor device comprising the steps of:
   forming a first insulation film on a surface of a semiconductor region of a first conductivity type;
   forming a first conductive film on said first insulation film;
   patterning said first conductive film;
   forming a second insulation film over the first conductive film;
   forming a first and a second impurity-diffused layer of a second conductivity type by implanting impurity ions in said semiconductor region with using said patterned first conductive film as a mask;
   forming a second conductive film over said first and second insulation films;
   forming a third insulation film over said second conductive film;
   performing an anisotropic etching to cause a lamination film of said second conductive film and said third insulation film to remain in a region of a side wall of said patterned first conductive film;
   forming a third and a fourth impurity-diffused layer of a second conductivity type by implanting impurity ions in said semiconductor region using said first and second conductive films and said second and third insulation films as masks, the concentration of impurities in said third and fourth impurity-diffused layers being higher than that of impurities in said first and second impurity-diffused layers;
   forming a fourth insulation film over the entire surface of the resulting structure;
   performing an anisotropic etching to expose surfaces, being substantially parallel to said semiconductor region, of said first and second conductive films; and
   selectively forming a third conductive film over said exposed first and second conductive films, said third conductive film connecting said first and second conductive films.

2. A method of manufacturing a semiconductor device comprising the steps of:
   forming a first insulation film on a main surface of a semiconductor region of a first conductivity type;
   forming a first conductive film on said first insulation film;
   patterning said first conductive film;
   forming a second insulation film over the first conductive film;
   forming a first and a second impurity-diffused layer of a second conductivity type by implanting impurity ions in said semiconductor region with using said patterned first conductive film as a mask;
   forming a second conductive film over said first and second insulation films;
   forming a third insulation film over said second conductive film;
   performing an anisotropic etching to cause a lamination film of said second conductive film and said third insulation film to remain in a region of a side wall of said patterned first conductive film;
   forming a third and a fourth impurity-diffused layer of the second conductivity type by implanting impurity ions in said semiconductor region using said first and second conductive films and said second and third insulation films as masks, the concentration of impurities in said third and fourth impurity-diffused layers being higher than that of impurities in said first and second impurity-diffused layers;
   forming a fourth insulation film over the entire surface of the resulting structure;
   performing an anisotropic etching to expose surfaces, being substantially parallel to said semiconductor region, of said first and second conductive films and said third and fourth impurity-diffused layers;
   selectively forming a third conductive film over said exposed first and second conductive films, and selectively forming a fourth conductive film over said exposed third and fourth impurity-diffused films, whereby said first and second conductive films are connected by said third conductive layer.

3. The method according to claim 2, wherein said third and fourth conductive films are simultaneously formed.

4. The method according to claim 2, wherein said third conductive film is formed after said fourth conductive film is formed.

5. The method according to claim 2, wherein said fourth conductive film is formed after said third conductive film is formed.

6. The method according to claim 1, wherein said first conductive film is a polycrystalline silicon film.

7. The method according to claim 2. wherein said first conductive film is a polycrystalline silicon film.

8. The method according to claim 1, wherein said second conductive film is a polycrystalline silicon film.

9. The method according to claim 2, wherein said second conductive film is a polycrystalline silicon film.

10. The method according to claim 1, wherein said third conductive film is made of a refractory metal.

11. The method according to claim 2, wherein said third conductive film is made of a refractory metal.

12. The method according to claim 1, wherein said third conductive film is made of a refractory metal silicide.

13. The method according to claim 2, wherein said third conductive film is made of a refractory metal silicide.

14. The method according to claim 1, wherein, in said step of performing an anisotropic etching to cause a lamination film of said second conductive film and said third insulation film to remain in a region of a side wall of said patterned first conductive film, the second insulation film formed on said first conductive film is removed.

15. The method according to claim 2, wherein, in said step of performing an anisotropic etching to cause a lamination film of said second conductive film and said third insulation film to remain in a region of a side wall of said patterned first conductive film, the second insulation film formed on said first conductive film is removed.

* * * * *